(12) United States Patent
Lee

(10) Patent No.: US 7,092,306 B2
(45) Date of Patent: Aug. 15, 2006

(54) SEMICONDUCTOR DEVICE CAPABLE OF ADJUSTING OPERATION TIMING USING ANTIFUSE

(75) Inventor: Kang-Youl Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 233 days.

(21) Appl. No.: 10/732,639

(22) Filed: Dec. 10, 2003

(65) Prior Publication Data

US 2004/0217386 A1    Nov. 4, 2004

(30) Foreign Application Priority Data

Apr. 30, 2003    (KR) .................. 10-2003-0027661

(51) Int. Cl.
*G11C 11/06*    (2006.01)
(52) U.S. Cl. ............... 365/225.7; 365/191; 365/194; 365/200; 365/189.05
(58) Field of Classification Search .......... 365/225.7, 365/230.08, 189.05, 191, 194, 200
See application file for complete search history.

(56) References Cited

U.S. PATENT DOCUMENTS 6,240,033 B1 *   5/2001   Yang et al. .............. 365/225.7

6,741,117 B1 *   5/2004   Lee ........................... 327/525

FOREIGN PATENT DOCUMENTS

KR      1020020034437       11/2000

* cited by examiner

*Primary Examiner*—Tuan T. Nguyen
*Assistant Examiner*—Pho M. Luu
(74) *Attorney, Agent, or Firm*—Blakely Sokoloff Taylor & Zafman

(57) ABSTRACT

A semiconductor device controls an error of the AC parameter caused by a processing variation without reproduction of the semiconductor device, thereby reducing the new design and developing time. The semiconductor device includes an antifuse unit having a plurality of programmable antifuses and producing digital coding signals by programming the antifuses in a test mode. The semiconductor device also includes a timing adjustor for adjusting an output time of an input signal by using the digital coding signals. The timing adjustor includes a plurality of capacitors for producing different delay times of the input signal, and a latch circuit for latching a delayed input signal in response to a data strobe signal.

16 Claims, 6 Drawing Sheets

SEMICONDUCTOR DEVICE CAPABLE OF ADJUSTING OPERATION TIMING USING ANTIFUSE

FIELD OF THE INVENTION

The present invention relates to an integrated circuit device; and, more particularly, to a semiconductor device to adjust an operation timing with an antifuse.

BACKGROUND OF THE INVENTION

With the development of semiconductor devices, the operation speed of semiconductor devices is getting more increased. Due to the high-speed operation of the semiconductor device, a timing margin for a signal processing is much decreased. Although there is a difference between the architecture design and the really manufactured circuit in the operation-timing margin, this difference is not an important factor in the low-speed semiconductor device; however, in the high-speed semiconductor device, such a difference does not make it possible to carry out a normal operation.

In recent, when the high-speed semiconductor device is developed, a sample device which is directly manufactured by a mass production plane is required to verify an existence of an error between the architecture design and the sample device. If an amount of error is more than the expected margin, the designer of the sample should modify and adjust the architecture. This has a drawback in that the developing time of the high-speed semiconductor device is much longer than that of the low speed semiconductor device.

FIG. 1 is a block diagram of a data input part of a conventional semiconductor device and FIG. 2 is detailed circuit diagram of the data input part in FIG. 1.

First, referring to FIG. 1, the conventional semiconductor device includes: a DQS (Data Strobe Signal) pulse generator 10 receiving a DQS signal and producing a DQS pulse signal DQSP whenever the DQS signal is inputted from an external circuit; first and second timing adjustors 20 and 40 receiving and delaying data D0 and D1 and outputting the delayed data D0_D and D1_D, respectively; and first and second data latch circuits 30 and 50 respectively latching the delayed data D0_D and D1_D from the first and second timing adjustors 20 and 40 in response to the DQS pulse signal DQSP and transferring the latched data D0_L and D1_L to an internal circuit of the semiconductor device.

Referring to FIG. 2, the DQS pulse generator 10 has inverters I1 to I3 for inverting the DQS signal, a NAND gate ND1 for performing a NAND operation of the DQS signal and an output signal of the inverter I3 and an inverter I4 for inverting an output signal of the NAND gate ND1 and for outputting an inverted signal as the DQS pulse signal DQSP.

The first timing adjustors 20 has inverters I5 and I6, which are in series coupled to each other, for receiving the data D0, buffering the received data D0 and outputting the buffered data to the first data latch circuit 30 and a capacitor Cd coupled to both a ground voltage level VSS and an output terminal of the inverter I5 for delaying an output signal of the inverter I5 for a predetermined time.

First data latch circuit 30 includes: an inverter I7 for inverting the DQS pulse signal DQSP in order to produce a switching signal; a transfer gate T1 for transferring the delayed data D0_D in response to the DQS pulse signal DQSP and the inverted DQS pulse signal from the inverter I7; inverters I8 and I9 for latching the data from the transfer gate T1; an inverter I10 for inverting the latched data by the inverters I8 and I9; a transfer gate T2 for transferring an output of the inverter I10 in response to the DQS pulse signal DQSP and the inverted DQS pulse signal from the inverter I7; inverters I11 and I12 for latching the data from the transfer gate T2; and an inverter I13 for inverting the latched data by the inverters I11 and I12.

The second data timing adjustor 40 has the same scheme as the first data timing adjustor 20 and the first latch circuit 30 also has the same scheme as the second data latch circuit 50. The number of the data timing adjustors and the latch circuits are determined according to the number of data; however, in this invention, the number of data timing adjustors and the latch circuits is limited into two blocks as shown in FIG. 1.

FIG. 3 is a timing chart illustrating an operation of the data input part in FIG. 1. The DQS signal is a signal indicative of data input timing in a synchronous memory device. The DQS signal is kept in a high impedance state in a normal mode and it goes to a preamble state of a low voltage level before one clock period of the data input. The clocking of the DQS signal is performed in the preamble state in response to the data input timing and it goes to a postamble state of a low voltage state after all of data are inputted and thereafter it is kept in a high impedance state. Accordingly, the clocking of the DQS signal means that the data are currently inputted.

The first data timing adjustor 20 receives the data D0, delays the input data D0 through the capacitor Cd for a predetermined time, and outputs the delayed data D0_D to the first latch circuit 30. Whenever the DQS signal is clocked, the DQS pulse generator 10 generates the DQS pulse signal DQSP and output the DQS pulse signal DQSP to the first and second data latch circuits 30 and 50.

The first latch circuit 30 latches the delayed data D0_D from the first data timing adjustor 20 in response to the DQS pulse signal DQSP from the DQS pulse generator 10. Accordingly, the delayed data D0_D is latched in the first data timing adjustor 20 for one period of the DQS pulse signal DQSP and the latch data D0_L may be transmitted to an internal circuit of the memory device for one period of the DQS pulse signal DQSP.

The reason why the data D0 is transmitted to the first data latch circuit 30 after it is delayed in the capacitor Cd of the first data timing adjustor 20 is that it takes longer time to generate the DQS pulse signal DQSP using the DQS signal and to transmit it to the first latch circuit 30 than to transmit the data D0 to the first latch circuit 30.

A DQS pin receiving the DQS signal is typically prepared every eight data pins. Further, the time the DQS pulse signal DQSP is transmitted to the data latch circuit is longer than the time the data signal is transmitted to the data latch circuits because the DQS pulse signal DQSP generated in the DQS pulse generator 10 is transmitted to eight data latch circuits.

Accordingly, the first data timing adjustor 20 delays the input data for a predetermined time and outputs the delayed data to the first data latch circuit 30 in order for the normally input data to be latched in the first data latch circuit 30. The capacitors Cd in the first and second data timing adjustors 20 and 40 have capacitance which is associated with the time the DQS pulse signal DQSP is transmitted to the first data latch circuit 30 and the data signal is transmitted to the first data latch circuit 30.

However, with the high speed performance of the memory device, the operating speed is getting higher and the data input margin, such as a set-up time tDS and data threshold time tDH, is fixed to a specific time or is getting smaller. Accordingly, if the real memory device is tested after the manufacture, it has a different timing margin from the designed one. Further, an error, which is caused by a variation of the capacitance of the capacitor Cd in the data timing adjustor, is also an important factor for the high-speed memory device.

In case that an error between the designed AC parameters, such as a data set-uptime tDS and data threshold time tDH, and the really tested AC parameters is larger than a allowable margin, the capacitance of the capacitor Cd in the data timing adjustor is controlled and the memory device is manufactured again based on the this controlled capacitance. As a result, the higher the operation speed of the memory device is, the longer the developing time of the memory device is.

SUMMARY OF THE INVENTION

It is, therefore, a primary object of the present invention is to provide a memory device capable of controlling AC parameters after the manufacturing processes so that the memory device has a stable operation against the processing variation.

Another object of the present invention is to provide a memory device to control a data input margin by modifying the AC parameters.

In accordance with an aspect of the present invention, there is provided a semiconductor device including: an antifuse unit for outputting digital coding signals, wherein the antifuse unit includes a plurality of antifuses and wherein the digital coding signals are created by the plurality of antifuses; and a timing adjusting means for adjusting an output timing of an input signal by using the digital coding signals.

In accordance with another aspect of the present invention, there is provided a semiconductor device including: an antifuse unit having a plurality of programmable antifuses and producing digital coding signals by programming the antifuses in a test mode; and a timing adjusting means for adjusting an output timing of an input signal by using the digital coding signals, wherein the timing adjusting means includes: a plurality of capacitors for producing different delay times of the input signal, wherein each of the digital coding signals selectively couples each of the capacitors to a signal path of the input signal; and a latch means for latching a delayed input signal in response to a data strobe signal. The antifuse unit includes: a plurality of unit antifuse parts, each of which has the programmable antifuse, for outputting a timing adjusting antifuse signal based on the short-circuit of the antifuse; and a timing adjusting decoder for producing the digital coding signals by decoding the timing adjusting antifuse signals from the plurality of unit antifuse parts. The antifuse unit further includes a plurality of signal selection units respectively correspondent to the plurality of unit antifuse parts, wherein the plurality of signal selection units selectively transfer output signals of the unit antifuse parts to the a timing adjusting decoder to adjust an output timing of the input signal in the timing adjusting means.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, an embodiment of the present invention will be described in detail accompanying the drawings.

Figure 1:
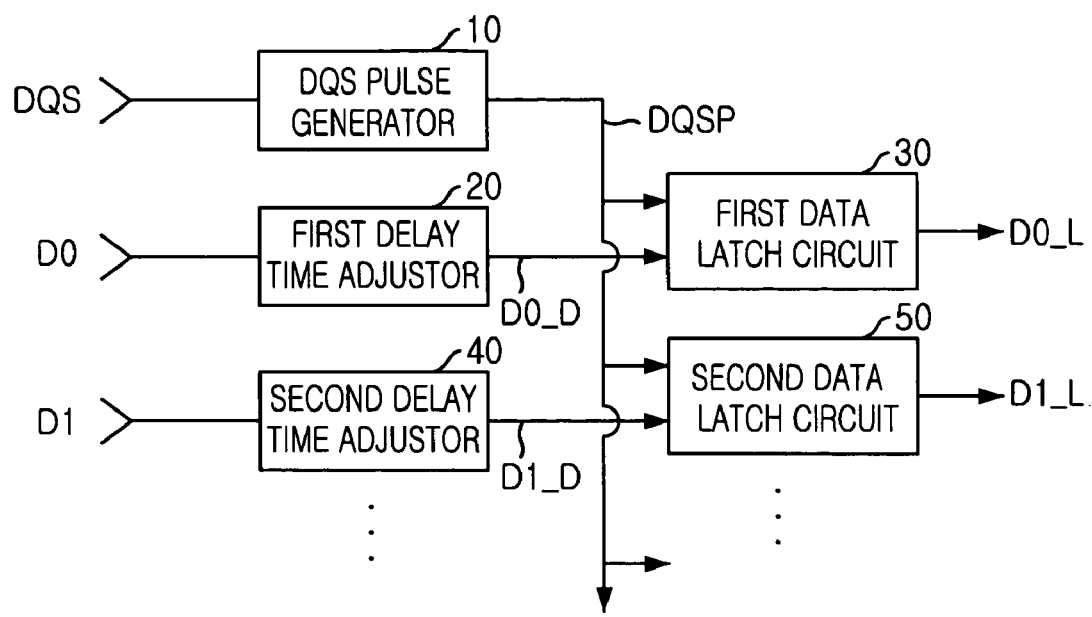
FIG. 1 is a block diagram of a data input part of a conventional semiconductor device.
Figure 2:
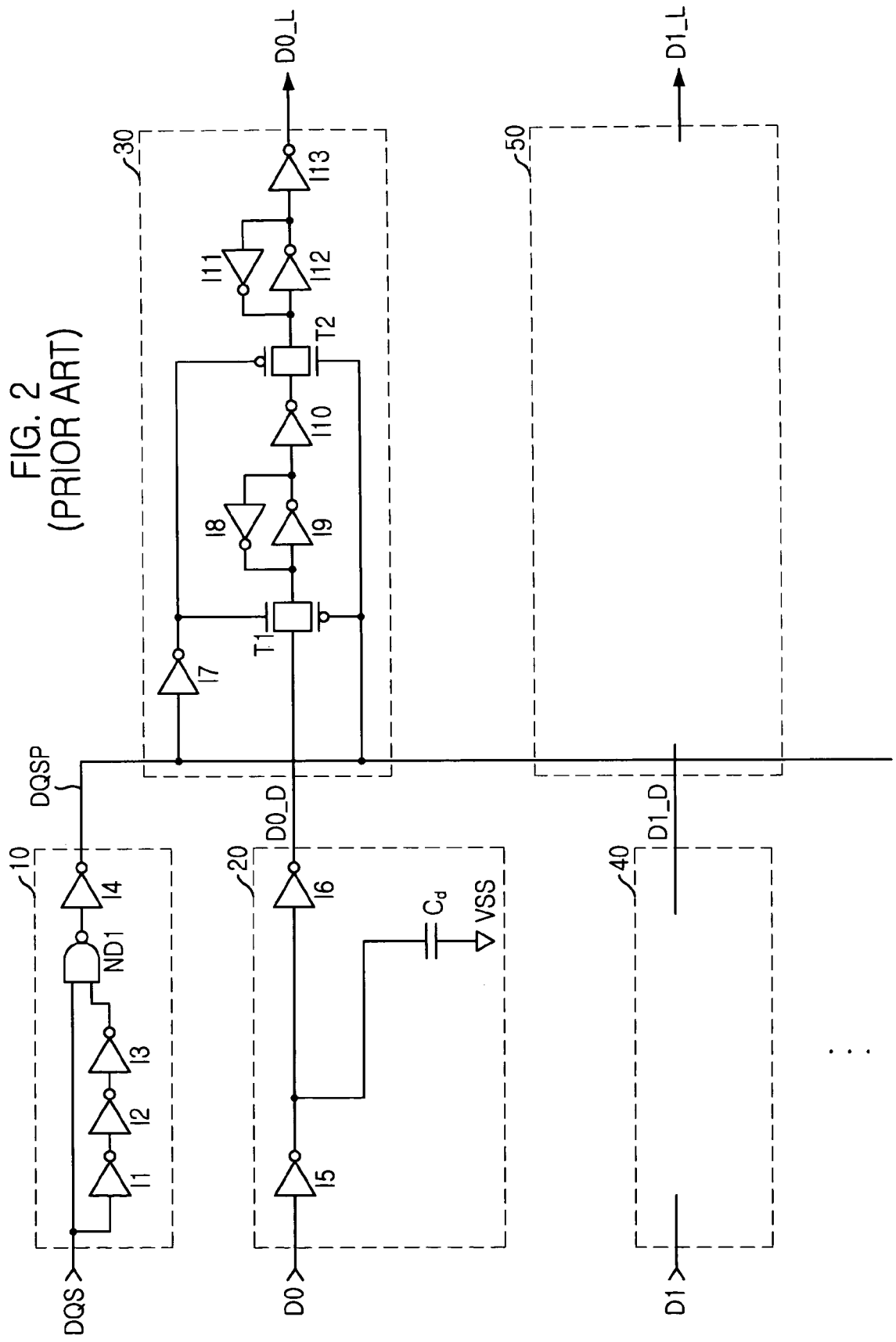
FIG. 2 is detailed circuit diagram of the data input part in FIG. 1.
Figure 3:
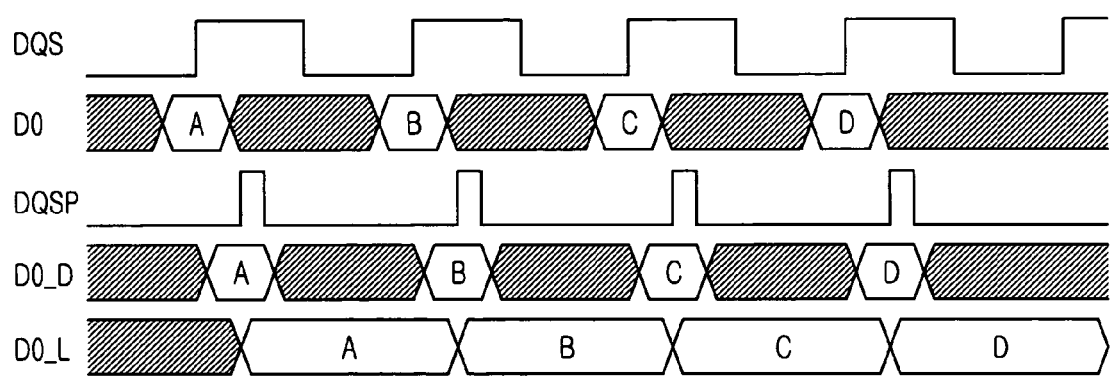
FIG. 3 is a timing chart illustrating an operation of the data input part in FIG. 1.
Figure 4:
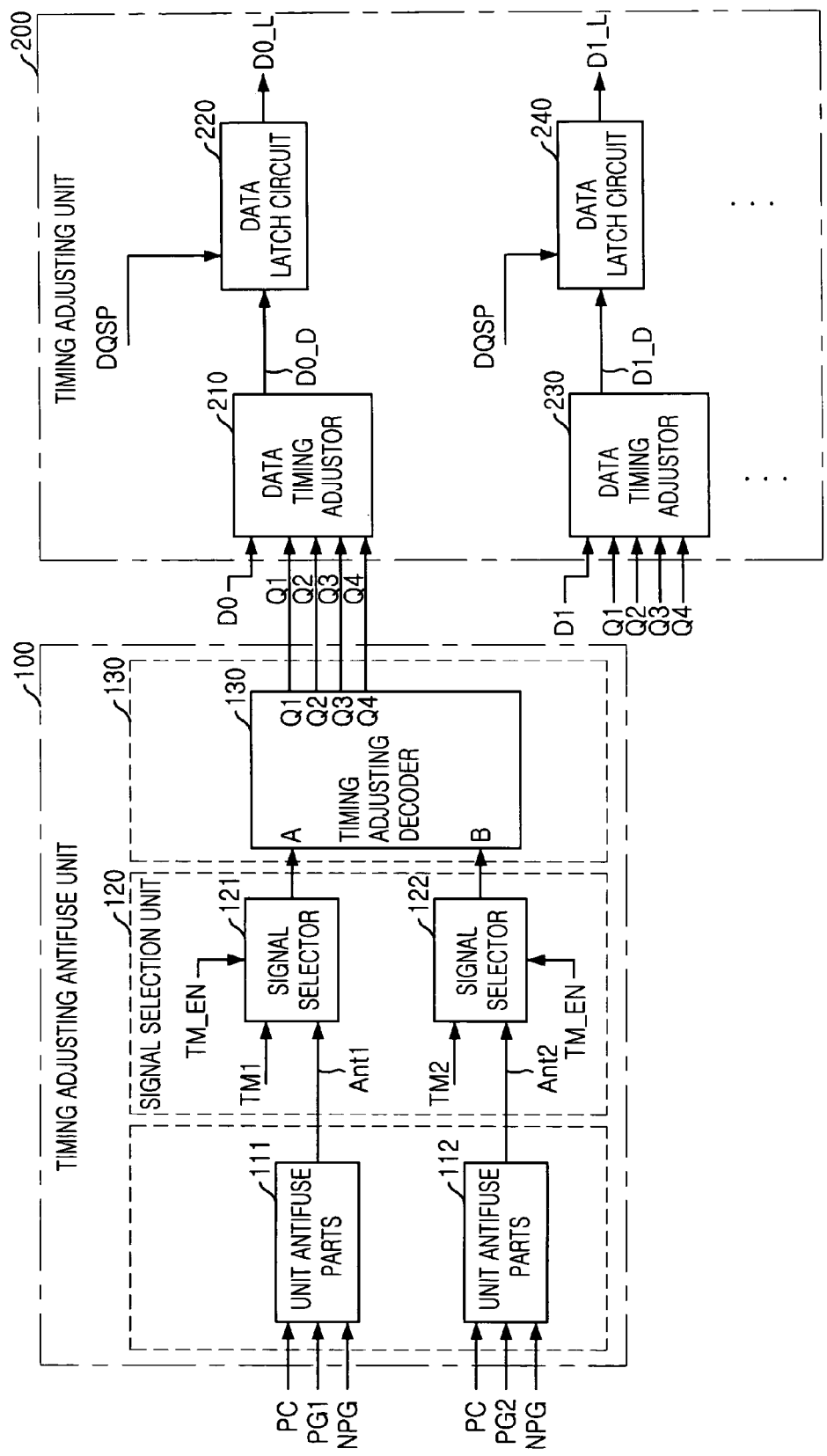
FIG. 4 is a block diagram of a data input timing adjustor according an embodiment of the present invention.

First, referring to FIG. 4, a memory device acceding to the present invention has a timing adjusting antifuse unit 100 to provide digital coding signals Q1 to Q4 through the short-circuit of the antifuses and a timing adjusting unit 200 to adjust an output timing of input data D0 using the digital coding signals Q1 to Q4.

The timing adjusting antifuse unit 100 includes a plurality of unit antifuse parts 111 and 112 which respectively output timing adjusting antifuse signals Ant1 and Ant2 according to the short-circuit of antifuses and a timing adjusting decoder 130 which produces the digital coding signals Q1 to Q4 by decoding the plurality of timing adjusting antifuse signals Ant1 and Ant2 from the plurality of unit antifuse parts 111 and 112. Further, the timing adjusting antifuse unit 100 includes a signal selection unit 120 having a plurality of signal selectors 121 and 122 that are respectively correspondent to the unit antifuse parts 111 and 112. Each of the signal selectors 121 and 122 selectively outputs one of test signals TM1 and TM2 for a test mode and the timing adjusting antifuse signals Ant1 and Ant2, respectively, in order to adjust a timing of an input signal.

The timing adjusting unit 200 includes a plurality of data timing adjustors 210 and 230, which respectively receive the data signals D0 and D1 and delay the input data signal D0 and D1 by a delay time corresponding to the digital coding signals Q1 to Q4 from the timing adjusting decoder 130, and a plurality of data latch circuits 220 and 240 which are respectively correspondent to the plurality of data timing adjustors 210 and 230 and which latch the data signals D0_D and D1_D from the plurality of data timing adjustors 210 and 230 in response to the DQS pulse signal DQSP created by the DQS signal.

Figure 5:
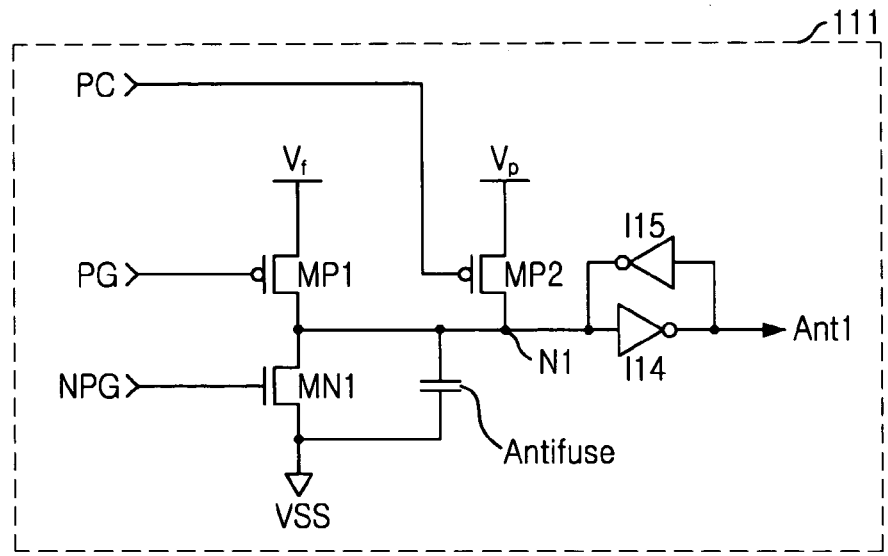
FIG. 5 is a block diagram of a unit antifuse part in FIG. 4.

Referring to FIG. 5 showing the unit antifuse part 111, it includes an antifuse, first to third MOS transistors MP1, MN1 and MP2, two inverters I14 and I15 for a latch operation. The antifuse is coupled to a ground voltage level VSS and node N1. The first MOS (PMOS) transistor MP1 provides a supply voltage Vf to node N1 in order to form a short-circuit of the antifuse in response to a programming signal PG. The second MOS (NMOS) transistor MN1 provides the ground voltage level VSS to node N1 in response to a programming release signal NPG. The inverters I14 and I15 to perform the latch operation are coupled to node N1 in order to latch a voltage applied to the antifuse. In addition, the third MOS (PMOS) transistor MP2 provides a precharge voltage Vp to node N1 in response to a precharge signal PC.

Figure 6:
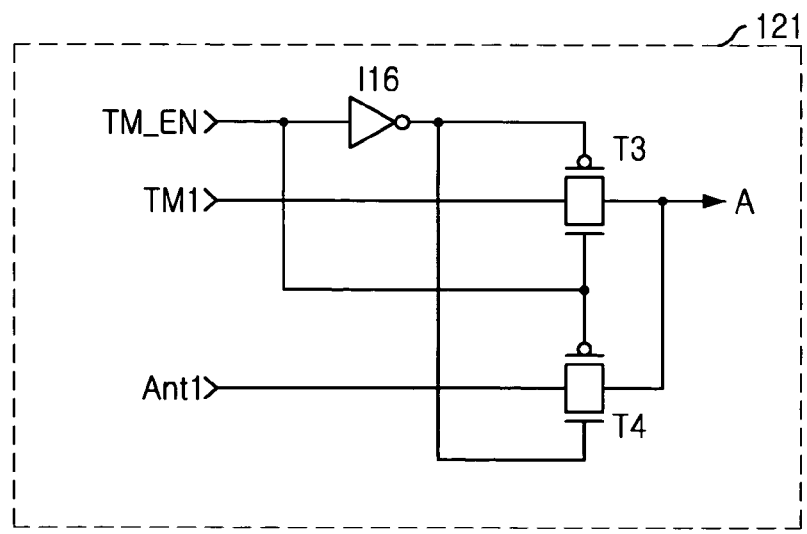
FIG. 6 is a block diagram of a signal selection unit in FIG. 4.

Referring to FIG. 6, the signal selector 121 includes a transfer gate T3, which is turned on by a test mode enable signal TM_EN of a high voltage level and then outputs the test signal TM1 to the timing adjusting decoder 130, and a transfer gate T4, which is turned on by a test mode enable signal TM_EN of a low voltage level and then outputs the timing adjusting antifuse signal Ant1 to the timing adjusting decoder 130. Accordingly, the signal selectors 121 selectively output one of the test signal TM1 and the timing adjusting antifuse signal Ant1 in response to the test mode enable signal TM_EN.

Figure 7:
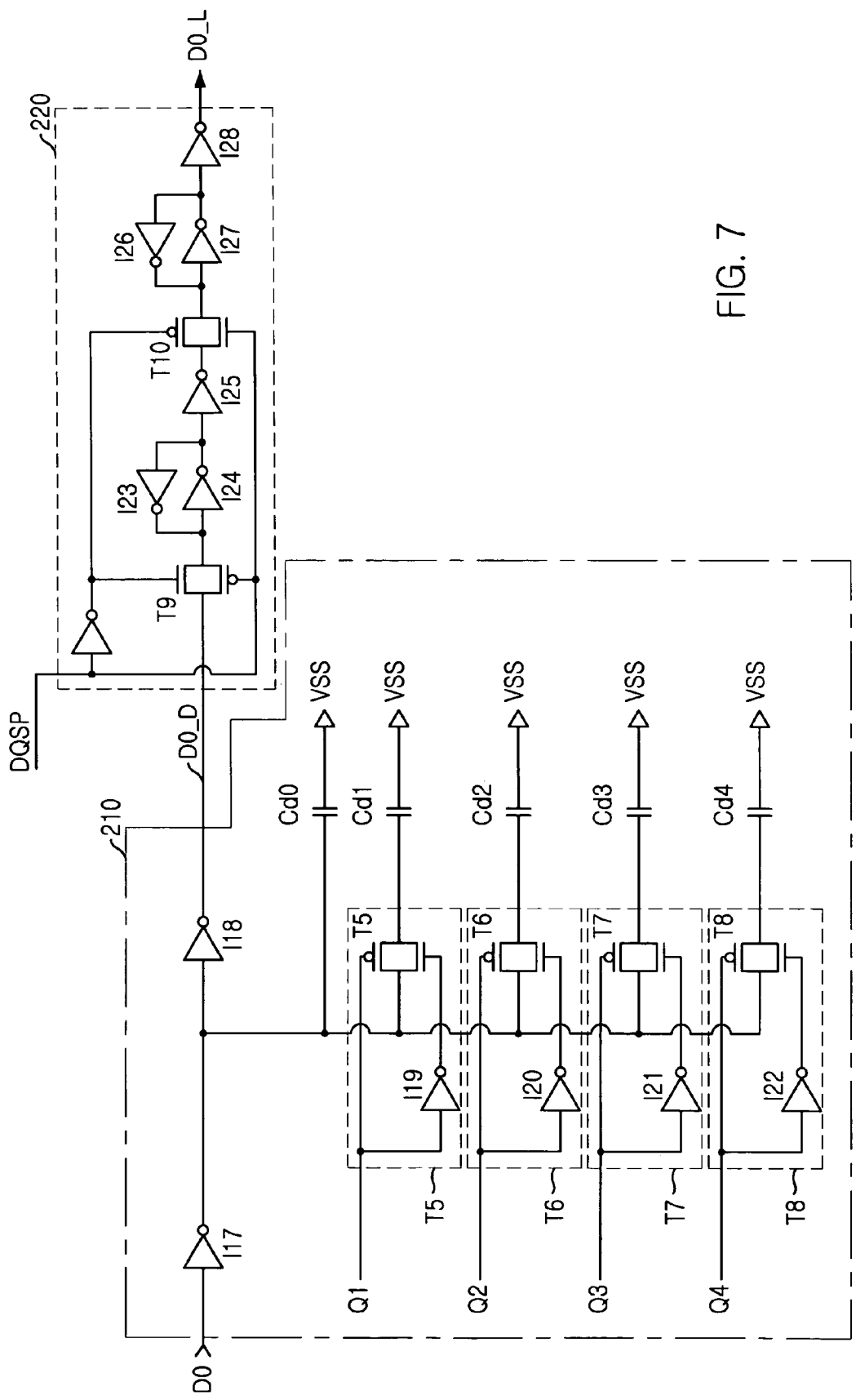
FIG. 7 is a block diagram of a data timing adjustor and a latch circuit in FIG. 4.

Referring to FIG. 7, the data timing adjustors 210 includes inverters I17 and I18 for buffering the input data signal D0, a plurality of capacitors Cd0 to Cd4 which are in parallel coupled to each other between an output terminal of the inverter I17 and the ground voltage level, a plurality of transfer gates T5 to T8 which respectively couple the output terminal of the inverter I17 to the capacitors Cd1 to Cd4, The data latch circuit 220 includes a transfer gate T9 which selectively transfers an output signal of the inverter I18 in response to the DQS pulse signal DQSP created by the DQS signal, inverters I23 and I24 to latch an output signal of the transfer gate T9, an inverter I25 to invert an output signal of the inverter I24, a transfer gate T10 which selectively transfers an output signal of the inverter I25 in response to the DQS pulse signal DQSP created by the DQS signal, inverters I26 and I27 to latch an output signal of the transfer gate T10, and an inverter I28 to invert an output signal of the inverter I27 and to output the latched data D0_L.

After manufacturing a memory device, a delayed time of the data D0 is measured by the data timing adjustor 210 in a test mode. The antifuses in the unit antifuse parts 111 and 112 are short-circuited according to an amount of the delayed time of the data D0. As shown in FIG. 5, in order to form a short-circuit of the antifuse in the unit antifuse part 111, the programming signal PG of a low voltage level is applied to the unit antifuse part 111. At this time, the first MOS transistor MP1 is turned on by the programming signal PG and the second MOS transistor MN1 is turned off by the programming release signal NPG of a low voltage level which is applied to the unit antifuse part 111. By doing so, the voltage capable of making a short-circuit is applied to the antifuse and the antifuse is short-circuited.

The antifuse is made up of two electrodes and a dielectric material sandwiched between the two electrodes. If a sufficient voltage difference is applied to the two electrodes, the dielectric characteristic of the dielectric material is destroyed and then the two electrodes are short-circuited.

The timing adjusting antifuse signals A and B, which are obtained by selectively short-circuiting an antifuse built in each of the unit antifuse parts 111 and 112, are inputted into the timing adjusting decoder 130. The timing adjusting decoder 130 outputs the digital decoding signals Q1 to Q4, which are produced by the encoded timing adjusting antifuse signals A and B, to each of the data timing adjustors 210 and 230.

In the data timing adjustors 210 and 230, one of the digital decoding signals Q1 to Q4 is selectively used as a control signal to couple the output terminal of the inverter I7 to one of the capacitors Cd1 to Cd4. The capacitor Cd0 is provided to have a basic delay time of the data signal D0. Also, since the capacitors Cd1 to Cd4 are different from each other in their capacitance and the capacitors Cd1 to Cd4 are selectively coupled to the output terminal of the inverter I7, the delay time created in the data timing adjustors 210 and 230 has a specific delay time which is different from other delay values. The data latch circuit 220 latches the delayed data D0_D from the data timing adjustors 210 in response to the DQS pulse signal DQSP and outputs the delay-latched data signal D0_L.

Although the present invention illustrates the data timing adjustment using four bits digital coding signals Q1 to Q4 of the timing adjusting decoder 130, this can be modified by eight or sixty bits together with the corresponding modification of the timing adjusting decoder 130 having three or four unit fuse parts.

The signal selector 121 is enabled by the test mode enable signal TM_EN and then selectively outputs the timing adjusting antifuse signal Ant1 or the test mode signal TM1. The test mode signal TM1 is an input signal in a test mode. An optimized delay time, which is required in the data timing adjustor 210, is searched after manufacturing the semiconductor device and the antifuses in the unit antifuse parts 11 and 112 selectively form a short-circuit based on the result of the search.

In the conventional semiconductor device, in case where an error between the designed AC parameters, such as such a set-up time tDS and data threshold time tDH, and the really tested AC parameters is larger than an allowable margin, the memory device should be manufactured again by other design rule. However, in the present invention, a test is carried out after manufacturing the semiconductor device and the prepared antifuses are short-circuited according to the result of the test. Therefore, the data delay time in the data timing adjustor can be controlled so that an error of the AC parameter caused by a processing variation can be solved.

Although the present invention illustrates data input/latch operation which has the shortest margin, this can be used to control other AC parameters. For example, the present invention can be employed in the memory device to control Data Set up/Threshold time tDS and (tDH), Input Command Sset-up/Hold time (tIS/tIH), Address Setup/Hold Time (tAS/tAH), Data Out edge to Clock edge skew (tAC), DQS out edge to Clock edge Skew (tDQSCK), Data out high impedance window from CK (tHZ) and Data out low impedance window from CK (tLZ).

As apparent from the above, the present invention can control an error of the AC parameter caused by a processing variation without reproduction of the semiconductor device, thereby reducing the new design and developing time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
   an antifuse unit for outputting digital coding signals, wherein the antifuse unit includes a plurality of unit antifuse parts, each of which has one of a plurality of antifuses, for outputting a timing adjusting antifuse signal based on a short-circuit of the antifuse, and wherein the digital coding signals are created by the plurality of antifuses; and
   a timing adjusting means for adjusting an output timing of an input signal by using the digital coding signals.

2. The semiconductor device as recited in claim 1, wherein the antifuse unit further includes:
   a timing adjusting decoder for producing the digital coding signals by decoding a plurality of timing adjusting antifuse signals from the plurality of unit antifuse parts.

3. The semiconductor device as recited in claim 2, wherein the antifuse unit further includes a plurality of signal selection units respectively correspondent to the plurality of unit antifuse parts, wherein the plurality of signal selection units selectively transfer output signals of the unit antifuse parts to the a timing adjusting decoder in order to adjust an output timing of the input signal in the timing adjusting means.

4. The semiconductor device as recited in claim 3, wherein each of the plurality of unit antifuse parts includes:
one of the plurality of antifuses coupled to a ground voltage level and a node;
a first MOS transistor providing a supply voltage to the node in order to form the short-circuit of the antifuse in response to a programming signal;
a second MOS transistor providing the ground voltage level to the node in order to form a short-circuit of the antifuse in response to a programming release signal; and
a latch means coupled to the node in order to latch a voltage applied to the antifuse and output the timing adjusting antifuse signal.

5. The semiconductor device as recited in claim 4, wherein the unit antifuse part further includes a third MOS transistor providing a precharge voltage to the node in response to a precharge signal.

6. The semiconductor device as recited in claim 3, wherein the signal selection unit includes;
a transfer gate, which is turned on by a test mode enable signal of a first logic level and which then outputs the test signal to the timing adjusting decoder; and
a transfer gate, which is turned on by the test mode enable signal of a second logic level and which then outputs the timing adjusting antifuse signal to the timing adjusting decoder.

7. The semiconductor device as recited in claim 3, wherein the timing adjusting means includes:
a plurality of data timing adjustors which respectively receive data signals and delay the input data signal by a delay time corresponding to the digital coding signals; and
a plurality of data latch circuits which are correspondent to the plurality of data timing adjustors, respectively, and which latch the data signals from the plurality of data timing adjustors in response to a data strobe signal.

8. The semiconductor device as recited in claim 7, wherein the data timing adjustor includes:
first and second inverters for buffering the data signal;
a plurality of capacitors which are in parallel coupled to each other between an output terminal of the first inverter and the ground voltage level;
a plurality of transfer gates which respectively couple the output terminal of the inverter to the plurality of capacitors.

9. The semiconductor device as recited in claim 8, wherein the data latch circuit includes:
a second transfer gate which selectively transfers an output signal of the second inverter in response to the data strobe signal;
third and fourth inverters and to latch an output signal of the second transfer gate;
a fifth inverter to invert an output signal of the fifth inverter;
a third transfer gate which selectively transfers an output signal of the fifth inverter in response to the data strobe pulse signal;
sixth and seventh inverters and to latch an output signal of the third transfer gate; and
an eighth inverter to invert an output signal of the seventh inverter and to output a latched data.

10. The semiconductor device as recited in claim 8, wherein the latch means includes:
a second transfer gate which selectively transfers an output signal of the second inverter in response to the data strobe signal;
third and fourth inverters and to latch an output signal of the second transfer gate;
a fifth inverter to invert an output signal of the fifth inverter;
a third transfer gate which selectively transfers an output signal of the fifth inverter in response to the data strobe pulse signal;
sixth and seventh inverters and to latch an output signal of the third transfer gate; and an eighth inverter to invert an output signal of the seventh inverter and to output a latched data.

11. A semiconductor device comprising:
an antifuse unit having a plurality of programmable antifuses and producing digital coding signals by programming the antifuses in a test mode; and
a timing adjusting means for adjusting an output timing of an input signal by using the digital coding signals,
wherein the timing adjusting means includes:
a plurality of capacitors for producing different delay times of the input signal, wherein each of the digital coding signals selectively couples each of the capacitors to a signal path of the input signal; and
a latch means for latching a delayed input signal in response to a data strobe signal.

12. The semiconductor device as recited in claim 11, the antifuse unit includes:
a plurality of unit antifuse parts, each of which has the programmable antifuse, for outputting a timing adjusting antifuse signal based on a short-circuit of the antifuse; and
a timing adjusting decoder for producing the digital coding signals by decoding the timing adjusting antifuse signals from the plurality of unit antifuse parts.

13. The semiconductor device as recited in claim 12, the antifuse unit further includes a plurality of signal selection units respectively correspondent to the plurality of unit antifuse parts, wherein the plurality of signal selection units selectively transfer output signals of the unit antifuse parts to the a timing adjusting decoder to adjust an output timing of the input signal in the timing adjusting means.

14. The semiconductor device as recited in claim 13, wherein the unit antifuse part includes:
an antifuse coupled to a ground voltage level and a node;
a first MOS transistor providing a supply voltage to the node in order to form a short-circuit of the antifuse in response to a programming signal;
a second MOS transistor providing the ground voltage level to the node in order to form a short-circuit of the antifuse in response to a programming release signal; and
a latch means coupled to the node in order to latch a voltage applied to the antifuse and output the timing adjusting antifuse signal.

15. The semiconductor device as recited in claim 13, wherein the signal selection unit includes;
a transfer gate, which is turned on by a test mode enable signal of a first logic level and which then outputs the test signal to the timing adjusting decoder; and
a transfer gate, which is turned on by the test mode enable signal of a second logic level and which then outputs the timing adjusting antifuse signal to the timing adjusting decoder.

16. The semiconductor device as recited in claim 14, wherein the unit antifuse part further includes a third MOS transistor providing a precharge voltage to the node in response to a precharge signal.

* * * * *